US012813046B2

(12) United States Patent
Wilcox et al.

(10) Patent No.: US 12,813,046 B2
(45) Date of Patent: Nov. 24, 2026

(54) LIGHT-EMITTING DIODE PACKAGES WITH MATERIALS FOR REDUCING EFFECTS OF ENVIRONMENTAL INGRESS

(71) Applicant: CreeLED, Inc., Durham, NC (US)

(72) Inventors: Robert Wilcox, Rolesville, NC (US); Michael Check, Holly Springs, NC (US); Andre Pertuit, Raleigh, NC (US); David Suich, Durham, NC (US); Joseph G. Sokol, Durham, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 664 days.

(21) Appl. No.: 18/304,836

(22) Filed: Apr. 21, 2023

(65) Prior Publication Data

US 2024/0355979 A1 Oct. 24, 2024

(51) Int. Cl.

| | |
|---|---|
| ***H10B 43/27*** | (2023.01) |
| ***G11C 11/408*** | (2006.01) |
| ***G11C 11/412*** | (2006.01) |
| ***G11C 11/418*** | (2006.01) |
| ***H01L 21/768*** | (2006.01) |
| ***H01L 23/48*** | (2006.01) |
| ***H01L 25/00*** | (2006.01) |
| ***H01L 25/065*** | (2023.01) |
| ***H10B 41/27*** | (2023.01) |

(Continued)

(52) U.S. Cl.
CPC ........ *H10H 20/857* (2025.01); *H10H 20/854* (2025.01)

(58) Field of Classification Search
CPC .. H10K 59/12; H10K 59/122; H10K 59/1201; H10K 50/00; H10K 50/10–19; H10K 50/11; H10K 50/15; H10K 50/16; H10K 50/17; H10K 50/171; H10K 2101/00; H10K 2101/10; H10K 2101/30; H10K 2101/60; H10K 85/10; H10K 50/846; H10H 20/854
See application file for complete search history.

(56) References Cited

U.S. PATENT DOCUMENTS 6,878,973 B2 * 4/2005 Lowery .............. H10H 20/8514 257/789
7,560,820 B2 * 7/2009 Amiotti ................ H10H 20/854 257/788

(Continued)

*Primary Examiner* — Wael M Fahmy
*Assistant Examiner* — Aneesa Riaz Baig
(74) *Attorney, Agent, or Firm* — Withrow & Terranova, P.L.L.C.

(57) ABSTRACT

Solid-state lighting devices including light-emitting diodes (LEDs) and more particularly LED packages with materials for reducing effects of environmental ingress are disclosed. Reactive materials are provided within LED packages that preferentially absorb environmental ingress away from other package elements, thereby extending operating lifetimes. Such reactive materials may be configured with redox potentials that are lower than the other package elements to more readily attract and react with environmental ingress that may enter LED packages under various operating environments. Arrangements of reactive materials are described relative to LED chips and corresponding electrical connections. Reactive materials may be formed as coatings, layers, pre-formed structures, and/or distributions of particles within LED packages.

20 Claims, 12 Drawing Sheets

(51) Int. Cl.

| | |
|---|---|
| ***H10B 41/30*** | (2023.01) |
| ***H10B 41/35*** | (2023.01) |
| ***H10B 43/30*** | (2023.01) |
| ***H10B 43/35*** | (2023.01) |
| ***H10H 20/854*** | (2025.01) |
| ***H10H 20/857*** | (2025.01) |
| ***H10W 72/00*** | (2026.01) |
| ***H10W 72/20*** | (2026.01) |
| ***H10W 72/30*** | (2026.01) |
| ***H10W 72/59*** | (2026.01) |
| ***H10W 72/90*** | (2026.01) |
| ***H10W 90/00*** | (2026.01) |

(56) References Cited

U.S. PATENT DOCUMENTS

| | | | | |
|---|---|---|---|---|
| 2005/0230691 | A1* | 10/2005 | Amiotti | H10H 20/854 257/788 |
| 2006/0283546 | A1* | 12/2006 | Tremel | C03C 3/066 257/E23.137 |
| 2006/0284556 | A1* | 12/2006 | Tremel | H10K 59/874 313/506 |
| 2013/0175920 | A1* | 7/2013 | Hikmet | F21V 31/00 313/504 |
| 2018/0040786 | A1* | 2/2018 | Chen | H10H 20/854 |
| 2019/0259925 | A1* | 8/2019 | Francis | C09D 143/04 |
| 2020/0006256 | A1* | 1/2020 | Yazzie | H10W 42/00 |
| 2023/0112649 | A1 | 4/2023 | Blakely et al. | |
| 2024/0072212 | A1* | 2/2024 | McFarlane | H10H 20/855 |
| 2024/0304766 | A1* | 9/2024 | Kim | H10H 20/8506 |

* cited by examiner

LIGHT-EMITTING DIODE PACKAGES WITH MATERIALS FOR REDUCING EFFECTS OF ENVIRONMENTAL INGRESS

FIELD OF THE DISCLOSURE

The present disclosure relates to solid-state lighting devices including light-emitting diodes (LEDs) and more particularly to LED packages with materials for reducing effects of environmental ingress.

BACKGROUND

Solid-state lighting devices such as light-emitting diodes (LEDs) are increasingly used in both consumer and commercial applications.

Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible. A practical goal to enhance emission efficiency is to maximize extraction of light emitted by the active region in the direction of the desired transmission of light. LED packages have been developed that can provide mechanical support, electrical connections, and encapsulation for LED chips with suitable emission efficiencies. During operation in various environments, adverse exposure to environmental conditions can lead to performance degradation of LED packages and associated LED chips. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to LED packages with materials for reducing effects of environmental ingress. Reactive materials are provided within LED packages that preferentially absorb environmental ingress away from other package elements, thereby extending operating lifetimes. Such reactive materials may be configured with redox potentials that are lower than the other package elements to more readily attract and react with environmental ingress that may enter LED packages under various operating environments. Arrangements of reactive materials are described relative to LED chips and corresponding electrical connections. Reactive materials may be formed as coatings, layers, pre-formed structures, and/or distributions of particles within LED packages.

In one aspect, an LED package comprises: at least one LED chip; a support structure comprising electrical connections coupled to the at least one LED chip; and a reactive material configured to preferentially absorb environmental ingress in greater amounts than the electrical connections. In certain embodiments, the reactive material comprises a lower redox potential than the electrical connections. In certain embodiments, the support structure comprises a submount and the electrical connections comprise a patterned trace on a top surface of the submount; and the reactive material is on the submount and laterally spaced from the patterned trace. In certain embodiments, the reactive material comprises a continuous layer on the submount that extends around a perimeter of at least three sides of the at least one LED chip. In certain embodiments, the reactive material comprises a plurality of discontinuous portions on surfaces of the submount between the at least one LED chip and corners of the submount. In certain embodiments, each discontinuous portion of the plurality of discontinuous portions is non-parallel with all edges of the submount. In certain embodiments, the reactive material comprises a plurality of discontinuous portions on the submount, and each discontinuous portion of the plurality of discontinuous portions has a longest width that is less than a width of the at least one LED chip.

In certain embodiments: the patterned trace is electrically coupled to a plurality of vias that extend through the submount; and each discontinuous portion of the plurality of discontinuous portions is on a surface of the submount between a peripheral edge of the submount and an individual via of the plurality of vias. In certain embodiments, the reactive material is on a top surface of the electrical connections.

In certain embodiments, the support structure comprises a submount and the electrical connections comprise a patterned trace on a top surface of the submount; the patterned trace forms a die attach pad for the at least one LED chip; and the reactive material is arranged along a perimeter of the die attach pad.

In certain embodiments, a thickness of the reactive material is greater than a thickness of the electrical connections. In certain embodiments, the reactive material is configured to be electrically active during operation. In certain embodiments, the support structure comprises additional electrical connections that are separately coupled to the reactive material.

In certain embodiments, the support structure comprises a lead frame structure and the electrical connections comprise portions of a lead frame.

The LED package may further comprise a cover structure over the at least one LED chip, wherein the reactive material forms a distribution of particles within the cover structure.

In another aspect, an LED package comprises: at least one LED chip; a lead frame at least electrically coupled to the at least one LED chip; and a reactive material configured to preferentially absorb environmental ingress in greater amounts than the lead frame. In certain embodiments, the reactive material is arranged on one or more surfaces of the lead frame. The LED package may further comprise a body formed about portions of the lead frame, wherein the reactive material is arranged on the body and spaced apart from the lead frame and the at least one LED chip. In certain embodiments, the body forms a recess in which the at least one LED chip is mounted, and the reactive material is arranged on a floor of the recess. In certain embodiments, the reactive material comprises a lower redox potential than the electrical connections.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
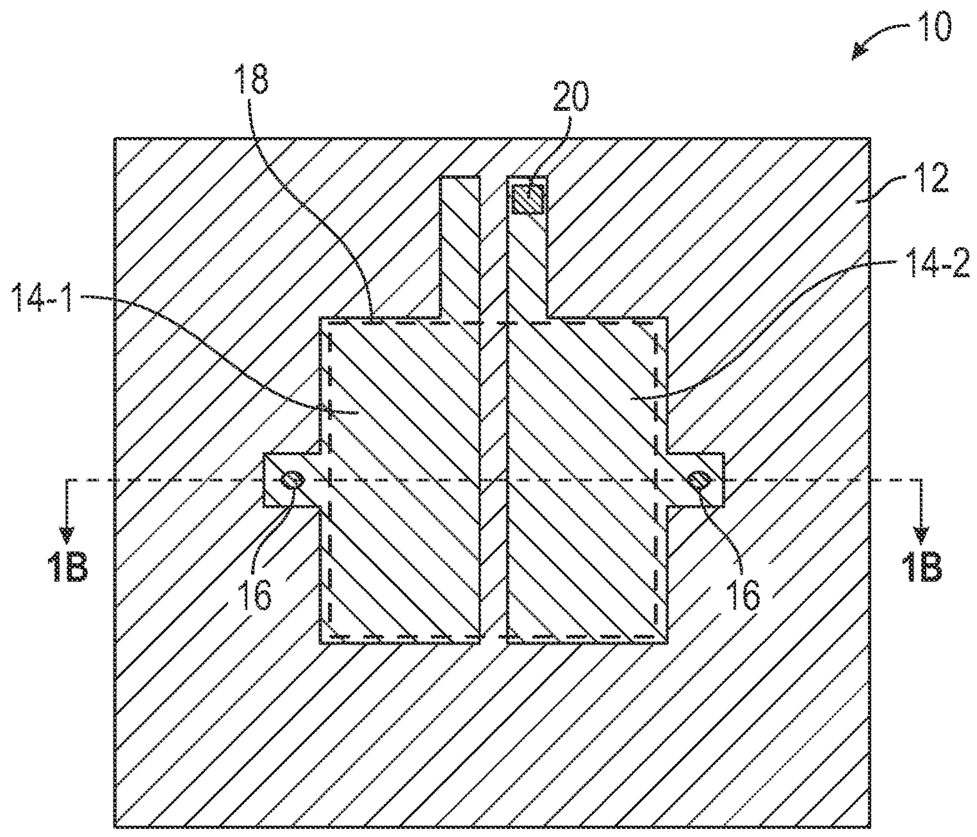
FIG. 1A is a top view of a portion of an exemplary light-emitting diode (LED) package that includes a support structure and a patterned trace according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to LED packages with materials for reducing effects of environmental ingress. Reactive materials are provided within LED packages that preferentially absorb environmental ingress away from other package elements, thereby extending operating lifetimes. Such reactive materials may be configured with redox potentials that are lower than the other package elements to more readily attract and react with environmental ingress that may enter LED packages under various operating environments. Arrangements of reactive materials are described relative to LED chips and corresponding electrical connections. Reactive materials may be formed as coatings, layers, pre-formed structures, and/or distributions of particles within LED packages.

Before delving into specific details of various aspects of the present disclosure, an overview of various elements that may be included in exemplary LED packages is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds. The active LED structure may be grown on a growth substrate that can include many materials, such as sapphire, SiC, aluminum nitride (AlN), and GaN, Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm.

The LED chip may also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations.

Light emitted by the active layer or region of an LED chip may typically travel in a variety of directions. For targeted directional applications, internal mirrors or external reflective surfaces may be employed to redirect as much light as possible toward a desired emission direction. As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board or a package submount. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a lead frame. Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent.

Aspects of the present disclosure are provided that include support structures for LED packages. A support structure may refer to a structure of an LED package that supports one or more other elements of the LED package, including but not limited to LED chips and cover structures. In certain embodiments, a support structure may include a submount on which an LED chip is mounted. Suitable materials for a submount include, but are not limited to, ceramic materials such as aluminum oxide or alumina, AlN, or organic insulators like polyimide (PI) and polyphthalamide (PPA). In other embodiments a submount may comprise a printed circuit board (PCB), sapphire, Si, or any other suitable material. For PCB embodiments, different PCB types can be used such as standard FR-4 PCB, metal core PCB, or any other type of PCB. In still further embodiments, the support structure may embody a lead frame structure. Aspects of the present disclosure are provided in the context of support structures for LED chips that may emit light in any number of wavelength ranges, including wavelengths within UV and/or visible light spectrums.

UV LEDs are of particular interest for use in applications related to the disinfection of microorganisms in air, water, and on surfaces, among others. In other applications, UV LEDs may also be provided with one or more lumiphoric materials to provide aggregated broad emissions with improved color quality in the visible spectrum. Certain embodiments of the present disclosure may be well suited for applications where LED emissions are provided in one or more of the UV-A, UV-B, and UV-C wavelength ranges. Lower peak wavelengths, such as peak wavelengths in one or more of the UV-B (e.g., 280 nm to 315 nm) and the UV-C (e.g., 100 nm to 280 nm) wavelength ranges, may have high energy levels that can lead to breakdown of materials commonly used in other LED packages, including silicone, polymers, and/or other organic materials that are commonly used as encapsulants and/or binders for reflective particles and/or lumiphoric materials. Cover structures for UV-based LED packages may also need to provide protection from external environmental exposure, such as providing hermetic sealing and the like. In this manner, cover structures for UV LEDs may include at least one of glass, quartz, and/or ceramic materials that provide reduced breakdown from exposure to UV emissions while also being able to be attached or otherwise bonded to package support structures to seal underlying LED chips.

Support structures for LED packages may include one or more electrically conductive materials that may provide electrical connections to LED chips. Electrically conductive materials may be provided as metal traces or patterned metal traces on a submount, or the electrically conductive materials may form a lead frame structure that may or may not include a corresponding submount. The electrically conductive materials may include any number of materials, including copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the electrically conductive materials may include ENEPIG or ENIG that include a top layer of Au. In other embodiments, electrically conductive materials may include a top layer of Ag. For UV-B and UV-C wavelength spectrums, Au and Ag exhibit poor reflectivity (e.g., about 20% to 40% reflectivity). In such embodiments, a layer with increased reflectivity relative to UV emissions, such as Al, may be arranged on or otherwise incorporated with the electrically conductive materials.

During operation of LED packages, exposure to surrounding environments can adversely impact operation. Environmental ingress may include one or more of oxygen, water, sulfur, and/or carbon monoxide reaching internal portions within an LED package. This can lead to various failures and/or reduced performance conditions such as corrosion, oxidation, and/or metal migration. For example, moisture ingress can cause metal migration and/or corrosion of materials from electrical traces and/or metal reflective layers within a package that can lead to various failure modes, including electrical shorting, current leakage, and reduced brightness, among others. In another example, sulfur contamination can lead to corrosion of metals, thereby reducing reflectivity and overall brightness. In the context of UV LED packages, Al may be present in increased quantities, such as within the active LED structure itself to provide UV wavelengths and/or incorporated with electrical trace metals as reflective surfaces. Al may be particularly susceptible to degradation associated with the above-described environmental exposure. In the context of visible light LED packages, encapsulation and/or lens materials sometimes include encapsulant materials, such as silicone, which can also be subject to environmental ingress during operation.

According to principles of the present disclosure, LED packages include reactive materials configured to preferentially absorb environmental ingress away from other portions of the LED package. The reactive materials may include various materials with lower redox potentials than other elements of the LED package, such as LED chips and corresponding electrical traces. For example, the reactive materials are preferential to absorbing environmental ingress by more readily losing electrons to oxidization than other elements of the LED package. In this manner, the reactive materials may effectively form scavenging materials that more readily attract and react with environmental ingress that makes its way within an LED package. The reactive materials may embody coatings, films, three-dimensional structures that protrude from package submounts, and/or dispersions of particles. Such reactive materials may be positioned on package submounts in a laterally spaced manner from LED chips and electrical traces. In other arrangements, the reactive materials may be positioned on top portions of the electrical traces. In still further embodiments, the reactive materials may be incorporated into encapsulant materials. Exemplary reactive materials may include one or more of zinc, magnesium, iron, silica, titanium, tungsten, zeolites, metal organic frameworks, activated carbon, carbon aerogels, and salts such as calcium chloride and/or sodium chloride, among others.

FIG. 1A is a top view of a portion of an exemplary LED package 10 that includes a support structure 12 and a patterned trace 14-1, 14-2 according to principles of the present disclosure. The patterned trace 14-1, 14-2 is collectively formed of several individual traces 14-1 and 14-2 that are discontinuous with one another on a topside or top face of the support structure 12. FIG. 1A is described in the context where the support structure 12 embodies a submount; however, the principles described are also applicable to other arrangements of the support structure 12, such as lead frames.

As illustrated in FIG. 1A, vias 16 may be provided that electrically connect the patterned trace 14-1, 14-2 to corresponding electrical connections on a backside or bottom face of the support structure 12. The patterned trace 14-1, 14-2 forms a die attach pad 18 for an LED chip where one of the individual traces 14-1 or 14-2 forms an anode pad of the die attach pad 18, and the other of the individual traces 14-1 or 14-2 forms a corresponding cathode pad of the die attach pad 18. In this manner, an LED chip may be flip-chip mounted to the die attach pad 18. In certain embodiments, protrusions of the patterned trace 14-1, 14-2 along the support structure 12 may extend away from the die attach pad 18 to position the vias 16 away from the mounting area of the LED. Other protrusions may extend away from the die attach pad 18 to form an attach area for another element, such as an electrical overstress element 20 (e.g., ESD chip, Zener diode, etc.) that may be coupled in parallel with the LED chip. For example, the electrical overstress element 20 of FIG. 1A may be mounted to the individual trace 14-2 and wire bonded to the individual trace 14-1. In other embodiments, the electrical overstress element 20 may alternatively be flip-chip mounted without the use of a wire bond. The patterned trace 14-1, 14-2 may include one or more layers of any of the electrically conductive materials described above for patterned metal traces.

Figure 1B:
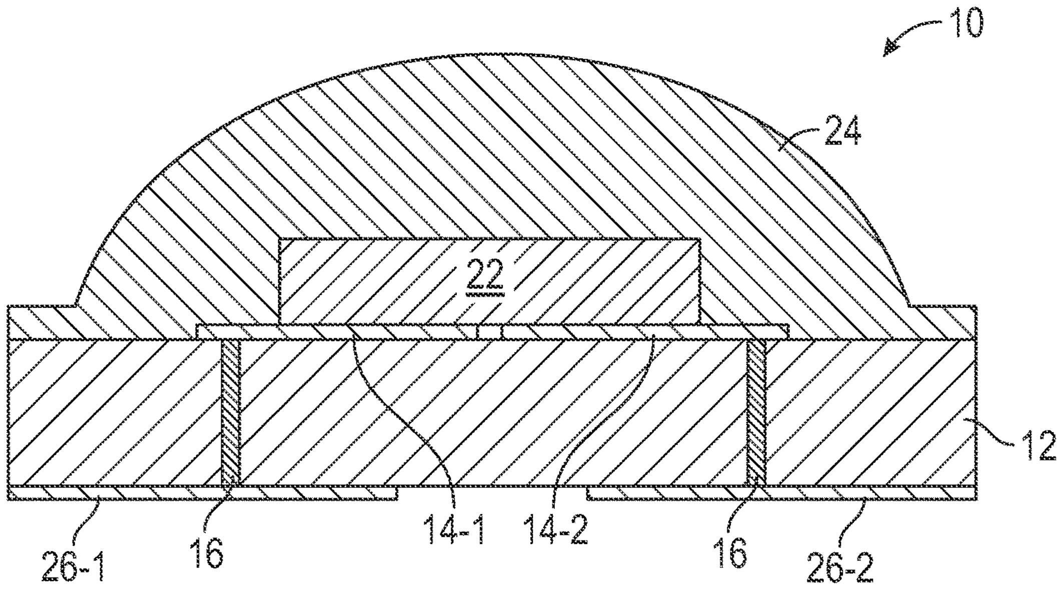
FIG. 1B is a cross-sectional view of the LED package of FIG. 1A taken along the sectional line 1B-1B of FIG. 1A and wherein the LED package is further assembled with at least one LED chip and a cover structure according to principles of the present disclosure.

FIG. 1B is a cross-sectional view of the LED package 10 of FIG. 1A taken along the sectional line 1B-1B of FIG. 1A and wherein the LED package 10 is further assembled with at least one LED chip 22 and a cover structure 24 according to principles of the present disclosure. As illustrated, the LED chip 22 is mounted and electrically coupled to the patterned trace 14-1, 14-2. The vias 16 extend through the support structure 12 to reach mounting pads 26-1, 26-2 of the LED package 10. In certain embodiments, the cover structure 24 may embody an encapsulant that covers and otherwise encapsulates the LED chip 22, the patterned trace 14-1, 14-2, and portions of the support structure 12. The cover structure 24 may comprise silicone, glass, or the like and in certain embodiments, the cover structure 24 may form the shape of a lens, such as the dome-shaped structure of FIG. 1B. Other suitable lens shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces. In certain embodiments, the cover structure 24 may conformally cover the topography on the topside of the support structure 12 to effectively encapsulate the LED chip 22 and patterned trace 14-1, 14-2. During exposure to various operating conditions, environmental ingress can occur such that substances foreign to the LED package 10, such as one or more of oxygen, water, sulfur, and/or carbon monoxide can reach the LED chip 22 and/or the patterned trace 14-1, 14-2. Such environmental ingress can compromise the integrity of LED package 10 by causing corrosion and/or metal migration and adversely impact performance.

Figure 2:
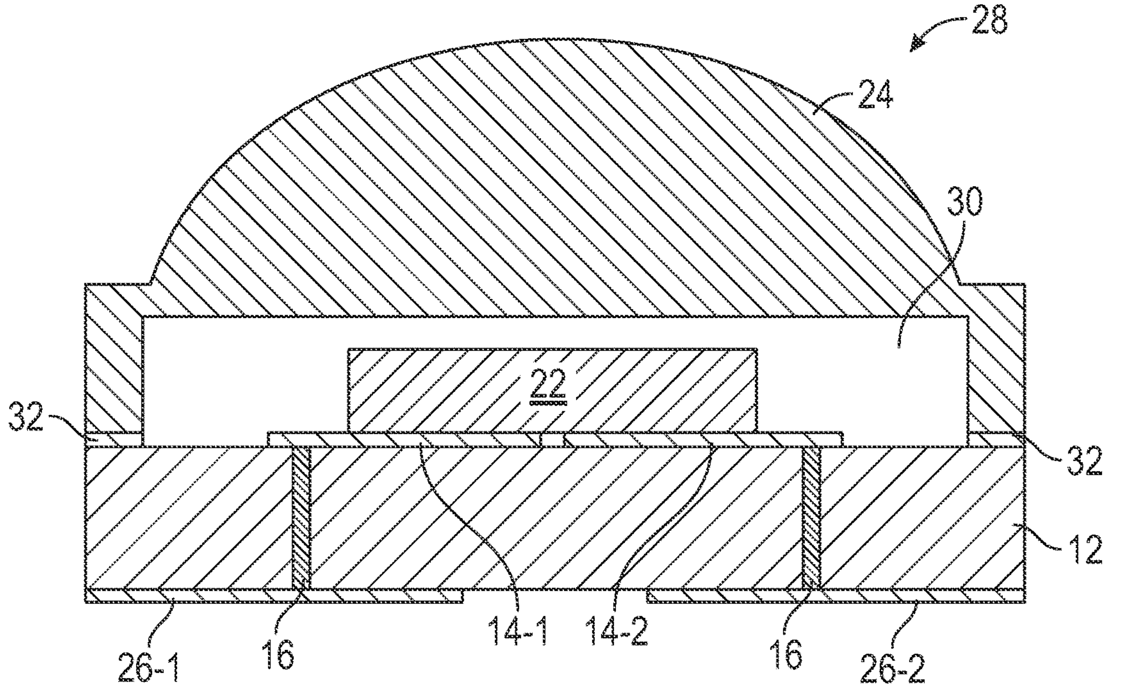
FIG. 2 is a cross-sectional view of another exemplary LED package according to principles of the present disclosure.

FIG. 2 is a cross-sectional view of another exemplary LED package 28 according to principles of the present disclosure. The LED package 28 is similar to the LED package 10 of FIG. 1B, except the cover structure 24 forms a cavity 30 or opening over the LED chip 22. In certain embodiments, the LED package 28 may be UV-based LED package, and the cover structure 24 may include at least one of glass, quartz, and/or ceramic materials that provide reduced breakdown from exposure to UV emissions from the LED chip 22 while also being able to be attached or otherwise bonded to the support structure 12 by way of bonding materials 32. In this regard, the cover structure 24 may embody a pre-formed structure that is subsequently bonded to the support structure 12. In certain embodiments, the bonding materials 32 may comprise a same material as the patterned trace 14-1, 14-2 and/or other adhesive materials. While the cover structure 24 may effectively form a seal about the LED chip 22 enclosed within the cavity 30, environmental ingress may still occur and adversely impact performance. In other applications, such as for visible light packages, the cover structure 24 could comprise pre-formed and hardened silicone.

Figure 3A:
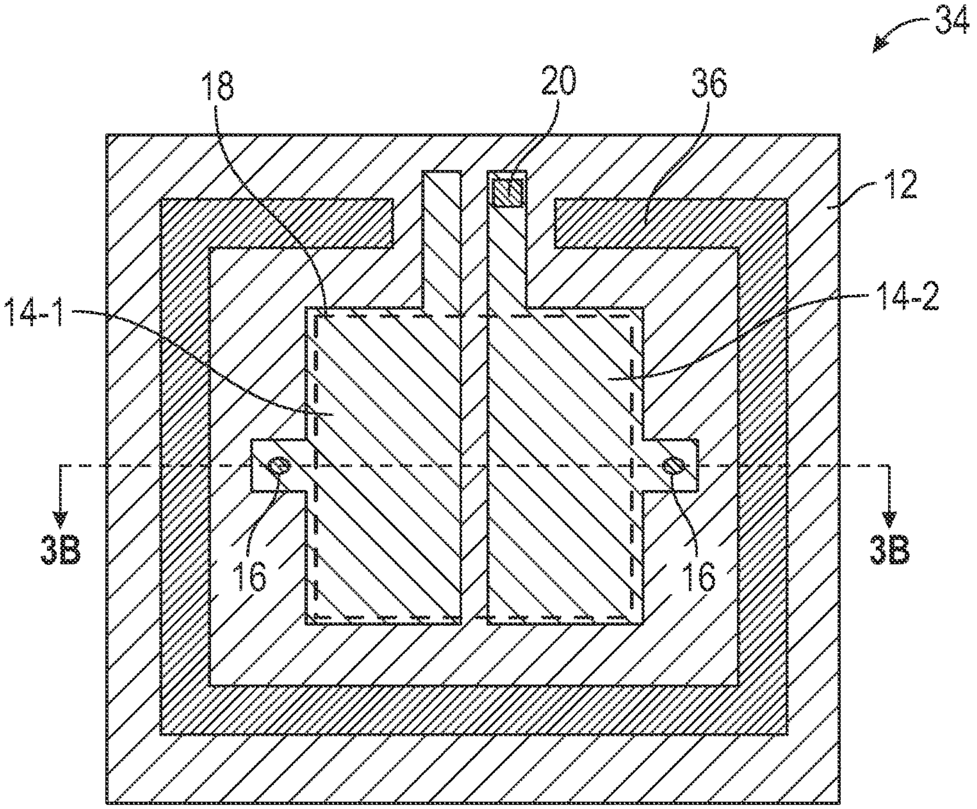
FIG. 3A is a top view of an exemplary LED package that is similar to the LED package of FIGS. 1A and 1B and further includes a reactive material arranged to preferentially absorb environmental ingress.

FIG. 3A is a top view of an exemplary LED package 34 that is similar to the LED package 10 of FIGS. 1A and 1B and further includes a reactive material 36 arranged to preferentially absorb environmental ingress. The reactive material 36 is arranged on the same surface of the support structure 12 as the die attach pad 18. In certain embodiments, the reactive material 36 is laterally spaced from the patterned trace 14-1, 14-2 on a top surface of the support structure 12. The reactive material 36 may embody a layer or coating that is selectively deposited or otherwise formed on such portions of the support structure 12. In the example of FIG. 3A, the reactive material 36 is formed as a continuous layer that extends around the patterned trace 14-1, 14-2 and die attach pad 18. In this manner, the reactive material 36 may form a continuous layer around at least two sides, around at least three sides, and/or around all sides of the die attach pad 18 where an LED chip will be mounted. In certain embodiments, the reactive material 36 may include a break to accommodate the location of the electrical overstress element 20 and corresponding protrusions of the patterned trace 14-1, 14-2. For embodiments where the reactive material 36 comprises an electrically conductive material, such as a metallization layer, the arrangement of the reactive material 36 provides electrical isolation with the patterned trace 14-1, 14-2.

Figure 3B:
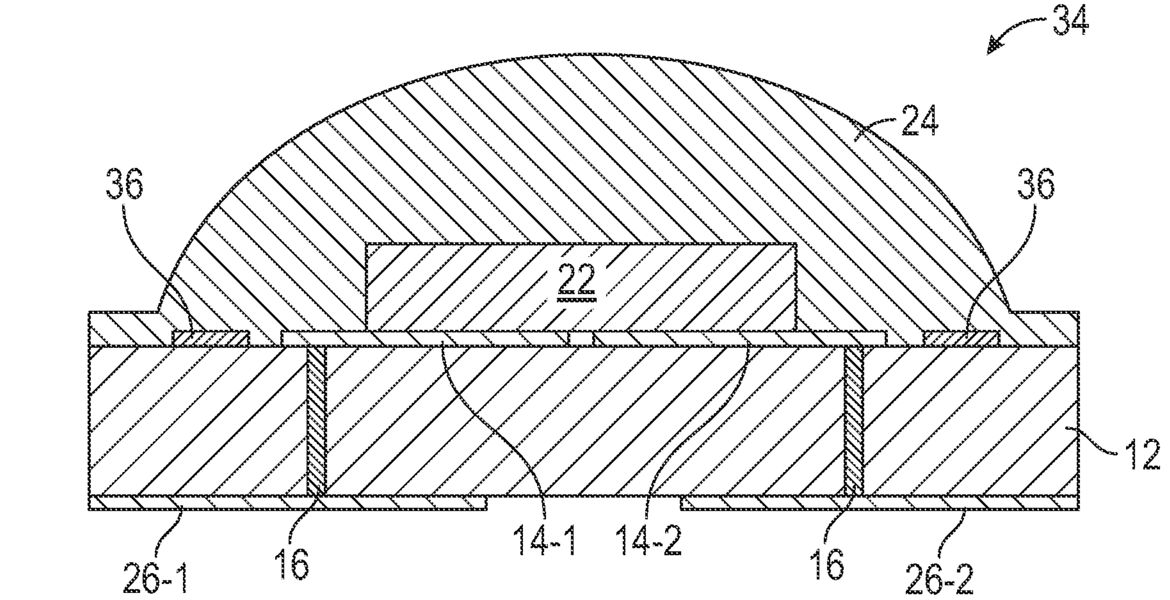
FIG. 3B is a cross-sectional view of the LED package of FIG. 3A taken along the sectional line 3B-3B of FIG. 3A and wherein the LED package is further assembled with at least one LED chip and a cover structure according to principles of the present disclosure.

FIG. 3B is a cross-sectional view of the LED package 34 of FIG. 3A taken along the sectional line 3B-3B of FIG. 3A and wherein the LED package 34 is further assembled with at least one LED chip 22 and the cover structure 24 according to principles of the present disclosure. In this manner, the LED package 34 of FIG. 3B is similar to the LED package 10 of FIG. 1B with the addition of the reactive material 36. During operation, environmental ingress may occur along the cover structure 24 and/or at interfaces between the cover structure 24 and the support structure 12. The presence of the reactive material 36, which is configured with a lower redox potential than the LED chip 22 and/or the patterned trace 14-1, 14-2, may preferentially absorb the environmental ingress and draw it away from the LED chip 22 and/or the patterned trace 14-1, 14-2. In the embodiment of FIGS. 3A and 3B, the reactive material 36 is positioned along all four sides of the LED chip 22 and patterned trace 14-1, 14-2. In this regard, external substances entering the LED package 34, particularly from along the perimeter edges, may first encounter the reactive material 36 before reaching the LED chip 22 and/or patterned trace 14-1, 14-2. Accordingly, the LED package 34 may be more robust to environmental ingress, thereby delaying adverse effects when corrosive or otherwise harmful materials enter the LED package 34.

Figure 4:
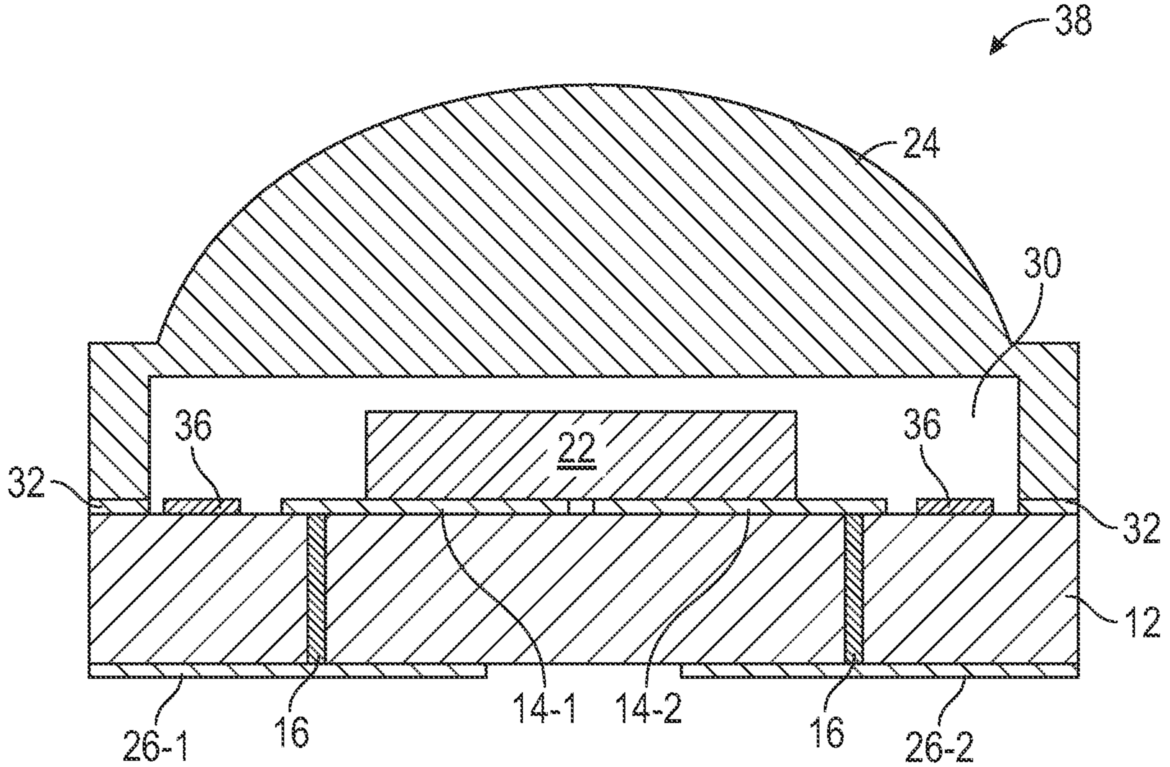
FIG. 4 is a cross-sectional view of an LED package that is similar to the LED package of FIG. 3B, except the cover structure is similar to the LED package of FIG. 2.

FIG. 4 is a cross-sectional view of an LED package 38 that is similar to the LED package 34 of FIG. 3B, except the cover structure 24 is similar to the LED package 28 of FIG. 2. In this manner, the cover structure 24 of the LED package 38 forms a cavity 30 or opening over the LED chip 22 and the cover structure 24 may be formed of a material that is more robust to UV light exposure. Despite the more robust material of the cover structure 24, environmental ingress may still reach the cavity 30, particularly along interfaces between the bonding materials 32 and the cover structure 24. In this manner, the presence of the reactive material 36 around the perimeter of the LED chip 22 and the patterned trace 14-1, 14-2 provides enhanced protection in a similar manner as described above for FIG. 3B.

Various arrangements of the reactive material 36 may be provided that are tailored to a particular application based on environmental conditions. Depending on the material selected, the reactive material 36 may corrode and darken over time with exposure. Such darkening can lead to reduced light output due to absorption. Accordingly, different arrangements of the reactive material 36 may be provided that reduce an overall area of the reactive material 36 while also providing sufficient protection. Certain arrangements include discontinuous portions of the reactive material 36 strategically placed proximate various elements of the LED packages for localized protection. Each discontinuous portion may have longest dimensions that are less than a width of the LED chip, or even less than half a width of the LED chip. FIGS. 5 to 11 illustrate alternative arrangements with reduced surface area of the reactive material as compared with the structure illustrated in FIG. 3A. The structures illustrated in FIGS. 5 to 11 may be implemented in various LED packages, such as those illustrated in FIG. 3B or FIG. 4, or in later-described lead frame packages.

Figure 5:
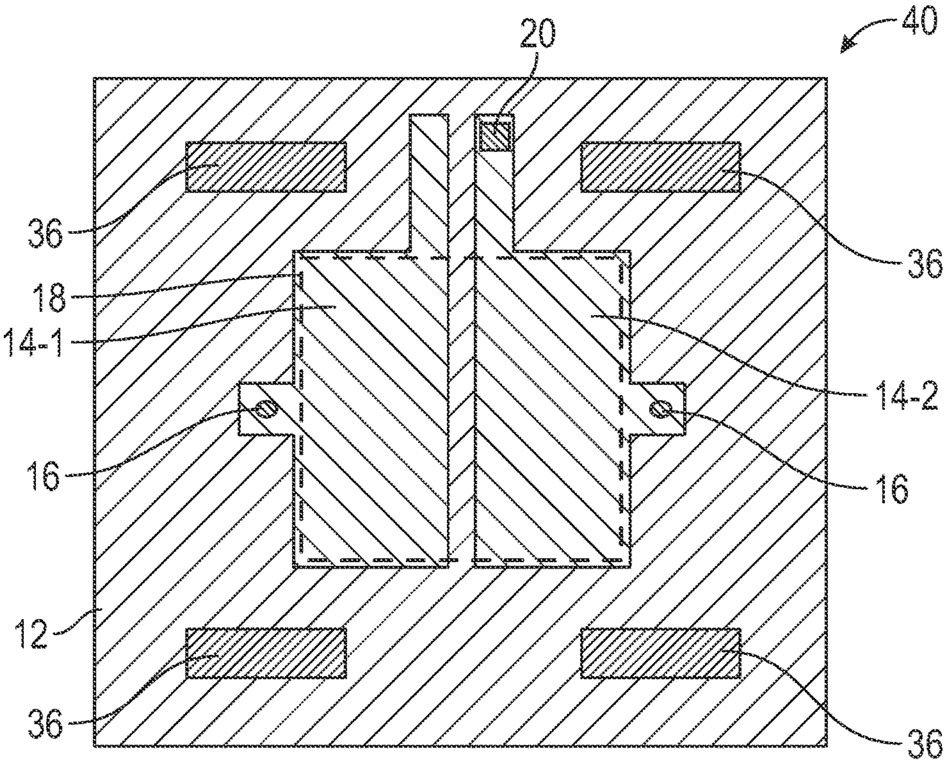
FIG. 5 is a top view of an LED package that is similar to the LED package of FIG. 3A except the reactive material is selectively provided adjacent corners of the support structure.

FIG. 5 is a top view of an LED package 40 that is similar to the LED package 34 of FIG. 3A except the reactive material 36 is selectively provided adjacent corners of the support structure 12. Rather than being continuously arranged around the support structure 12, the reactive material 36 is provided as a number of discontinuous portions. In this regard, if the reactive material 36 darkens over time, the light loss associated with absorption may be reduced. As illustrated, the discontinuous portions of the reactive material 36 are arranged between the patterned trace 14-1, 14-2 and corners of the support structure 12, thereby targeting environmental ingress that may first occur at the corners. Additionally, the reactive material 36 may continue to attract and absorb ingress that enters from other locations. In certain embodiments, the discontinuous portions of the reactive material 36 are arranged to extend parallel to at least one peripheral edge of the support structure 12.

Figure 6:
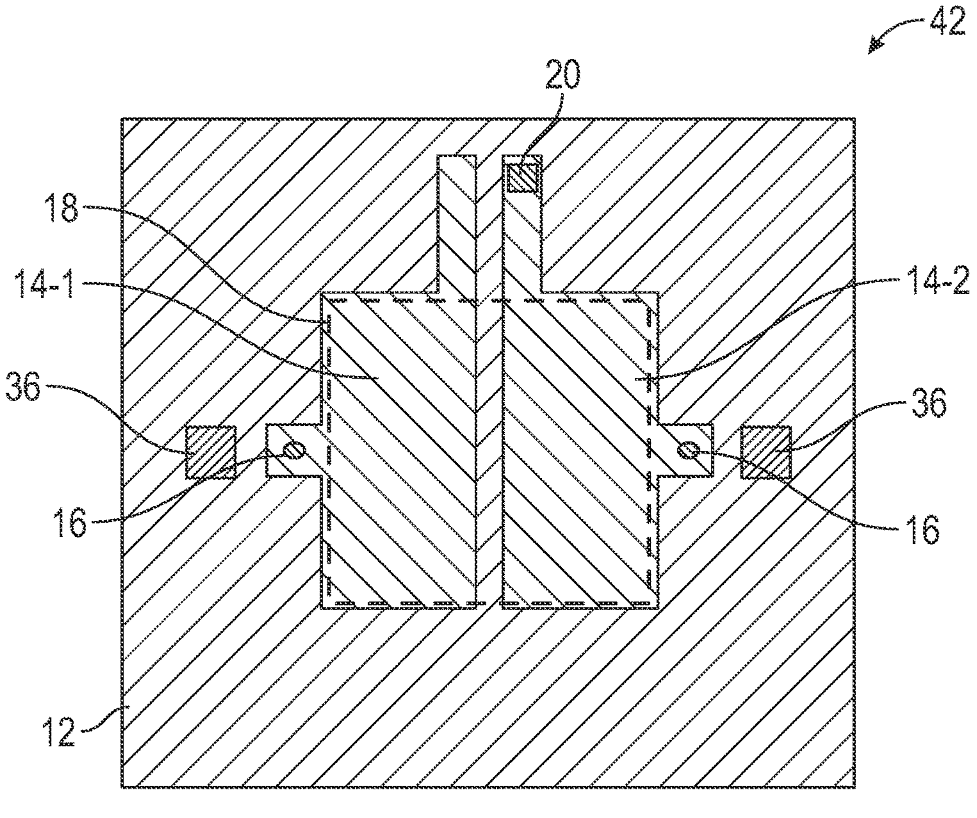
FIG. 6 is a top view of an LED package that is similar to the LED package of FIG. 5 except the reactive material is provided as discontinuous portions proximate the vias.

FIG. 6 is a top view of an LED package 42 that is similar to the LED package 40 of FIG. 5 except the reactive material 36 is provided as discontinuous portions proximate the vias 16. As illustrated, the discontinuous portions of the reactive material 36 occupy small surfaces areas between the vias 16 and perimeter edges of the support structure 12. For example, each of the discontinuous portions of the reactive material 36 are provided such that a longest dimension of each discontinuous portion is less than half a width of the die attach pad 18 or the LED chip when mounted. Additionally, the discontinuous portions of the reactive material 36 are arranged on a surface of the support structure 12 that is between locations of the vias 16 and peripheral edges of the support structure 12. In this regard, the reactive material 36 is arranged to protect the electrically conductive paths provided by the vias 16 while also occupying a reduced area of the support structure 12.

Figure 7:
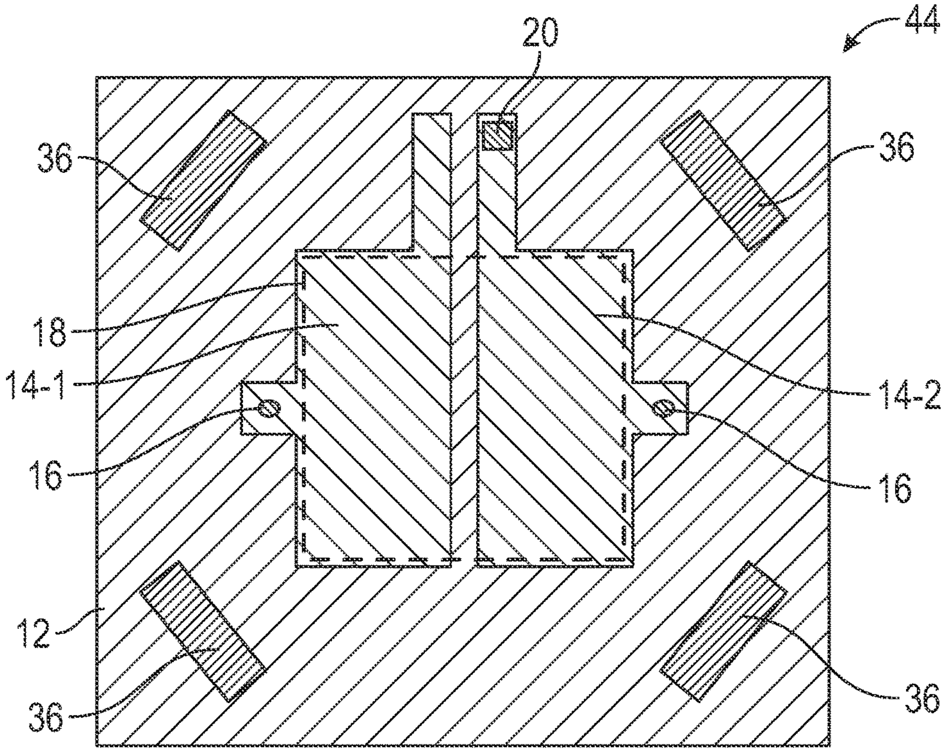
FIG. 7 is a top view of an LED package that is similar to the LED package of FIG. 5 except the discontinuous portions of the reactive material are angled with respect to the corners of the support structure.

FIG. 7 is a top view of an LED package 44 that is similar to the LED package 40 of FIG. 5 except the discontinuous portions of the reactive material 36 are angled with respect to the corners of the support structure 12. As illustrated, the discontinuous portions are non-parallel with any edge of the support structure 12. By angling the discontinuous portions as illustrated in FIG. 7, further coverage may be provided for environmental ingress that enters the LED package 44 at or near the corners of the support structure 12.

Figure 8:
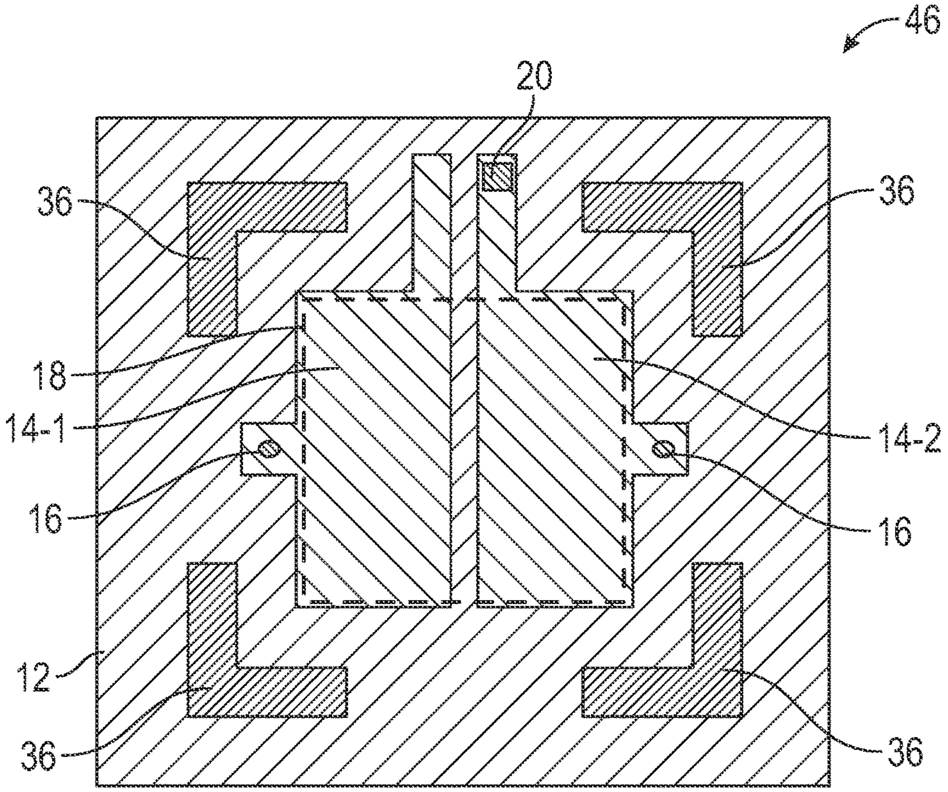
FIG. 8 is a top view of an LED package that is similar to the LED package of FIG. 5 except the discontinuous portions of the reactive material extend parallel with at least two edges of the support structure proximate corners of the support structure.

FIG. 8 is a top view of an LED package 46 that is similar to the LED package 40 of FIG. 5 except the discontinuous portions of the reactive material 36 extend parallel with at least two edges of the support structure 12 proximate corners of the support structure 12. For example, an individual discontinuous portion that is proximate one of the corners is arranged to extend in two directions that are parallel to intersecting peripheral edges of the support structure 12. Such an arrangement provides increased coverage of the reactive material 36 along the corners for increased protection.

Figure 9:
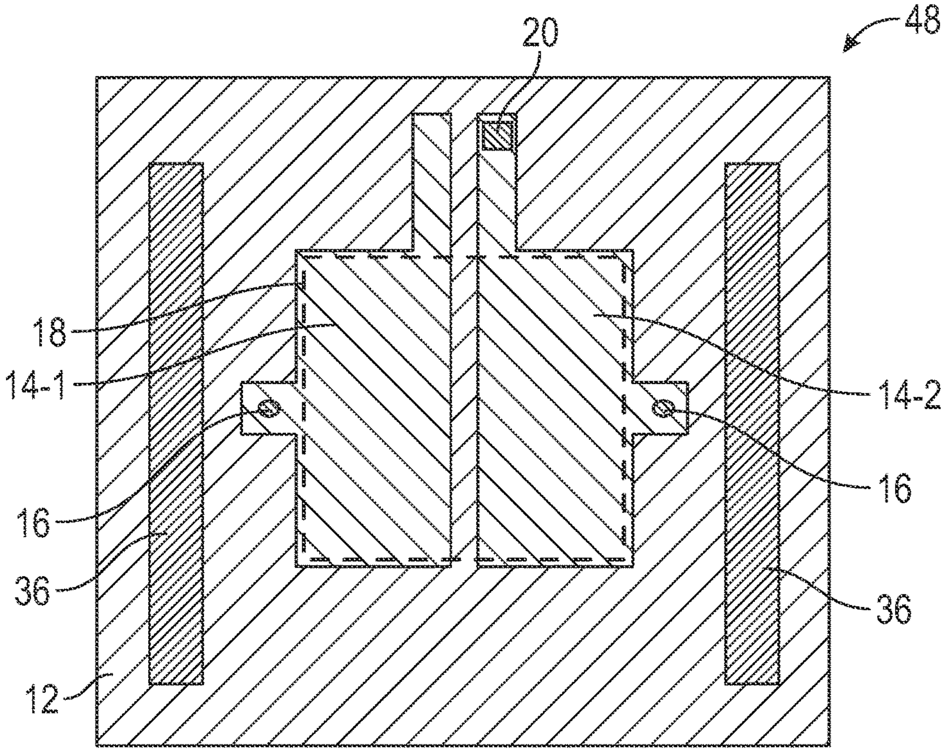
FIG. 9 is a top view of an LED package that is similar to the LED package of FIG. 5 except two discontinuous portions of the reactive material are arranged to extend along opposite sides of the patterned trace.

FIG. 9 is a top view of an LED package 48 that is similar to the LED package 40 of FIG. 5 except two discontinuous portions of the reactive material 36 are arranged to extend along opposite sides of the patterned trace 14-1, 14-2. In certain embodiments, the discontinuous portions extend on opposite sides of the patterned trace 14-1, 14-2 proximate locations of the vias 16. The discontinuous portions may also extend parallel to opposite peripheral edges of the support structure 12 and between adjacent corners of the support structure 12.

Figure 10:
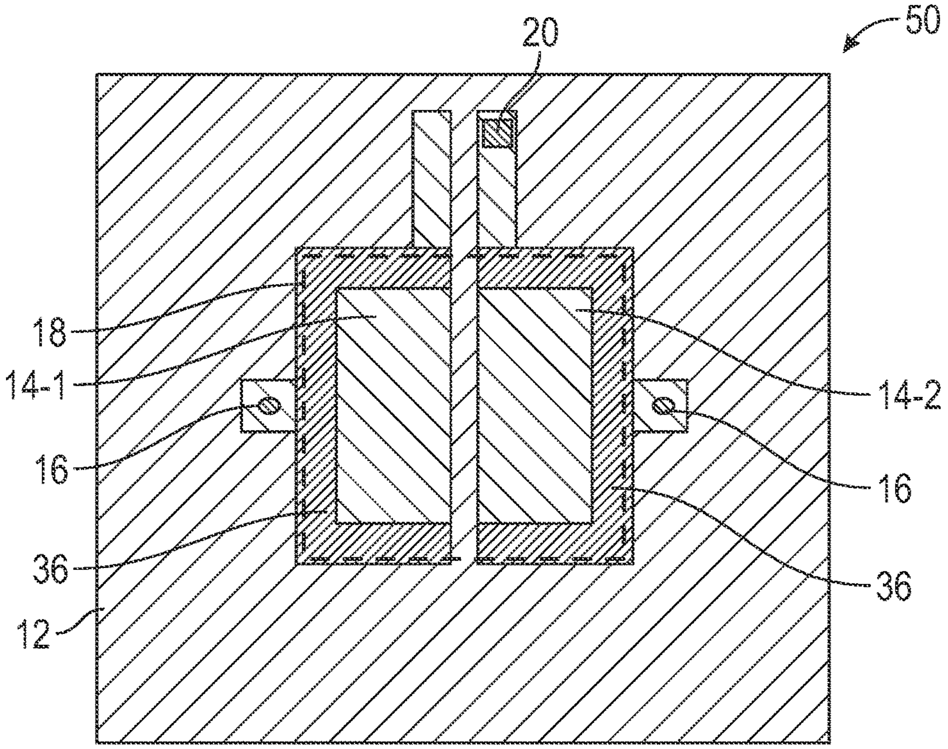
FIG. 10 is a top view of an LED package that is similar to the LED package of FIG. 5 except the reactive material is arranged on a top surface of the patterned trace proximate the die attach pad.

FIG. 10 is a top view of an LED package 50 that is similar to the LED package 40 of FIG. 5 except the reactive material 36 is arranged on a top surface of the patterned trace 14-1, 14-2 proximate the die attach pad 18. For example, one portion of the reactive material 36 may be arranged on the individual trace 14-1 and another portion of the reactive material 36 may be arranged on the individual trace 14-2. By arranging the reactive material 36 on top surfaces of the patterned trace 14-1, 14-2, the reactive material 36 may be arranged closer to targeted areas for protection. For example, the reactive material 36 may be arranged to follow a perimeter of the die attach pad 18. In this manner, an anode and cathode of an LED chip may be mounted and electrically coupled to the patterned trace 14-1, 14-2 inside a perimeter of the reactive material 36. In this regard, the reactive material 36 may form a perimeter barrier along the die attach pad 18 to reduce environmental ingress between an LED chip and the underlying die attach pad 18.

Figure 11:
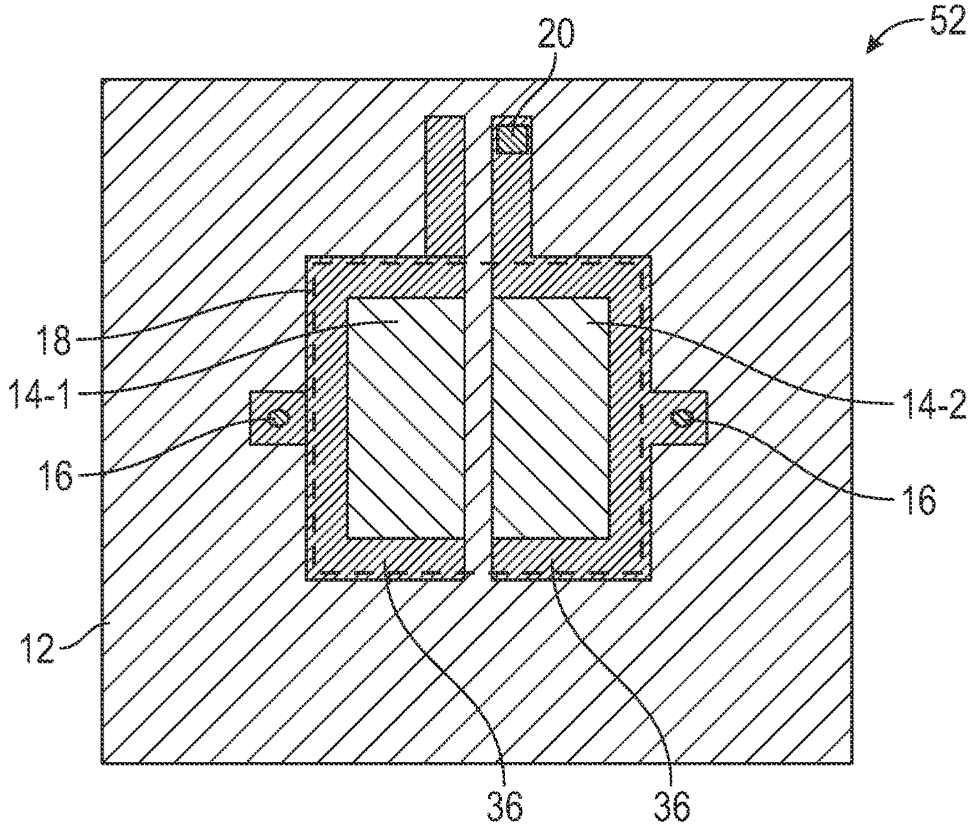
FIG. 11 is a top view of an LED package that is similar to the LED package of FIG. 10 where the reactive material is further arranged to cover additional portions of the patterned trace outside the die attach pad.

FIG. 11 is a top view of an LED package 52 that is similar to the LED package 50 of FIG. 10 where the reactive material 36 is further arranged to cover additional portions of the patterned trace 14-1, 14-2 outside the die attach pad 18. In certain embodiments, the reactive material 36 may cover one or more of the protrusions of the patterned trace 14-1, 14-2 that accommodate the vias 16 and/or the electrical overstress element 20. In certain embodiments, the reactive material 36 may cover all portions of the patterned trace 14-1, 14-2 outside a perimeter of the die attach pad 18.

Figure 12:
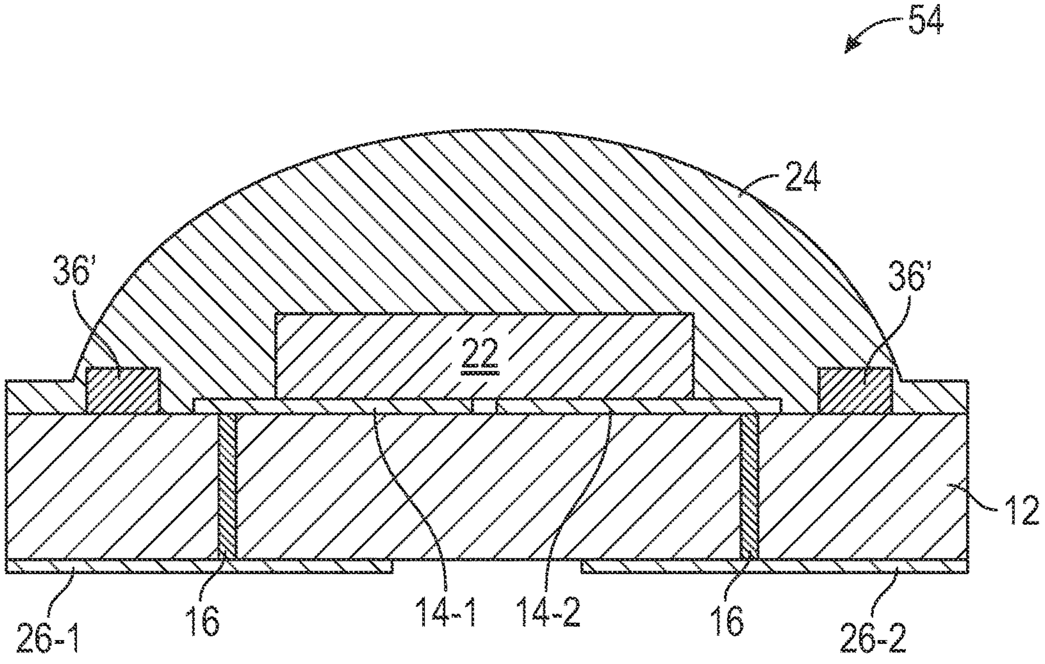
FIG. 12 is a cross-sectional view of an LED package that is similar to the LED package of FIG. 3B for embodiments where the reactive material is formed with increased thickness.
Figure 13:
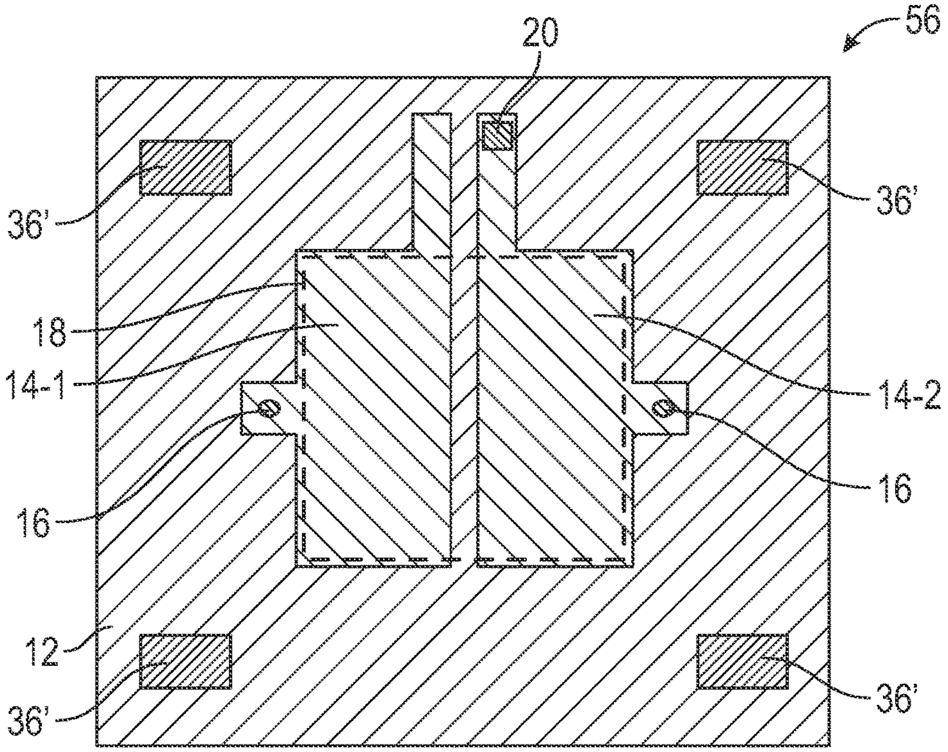
FIG. 13 is a top view of an LED package that is similar to the LED package of FIG. 12 where the thicker reactive material is formed as discontinuous portions proximate corners of the support structure.
Figure 14:
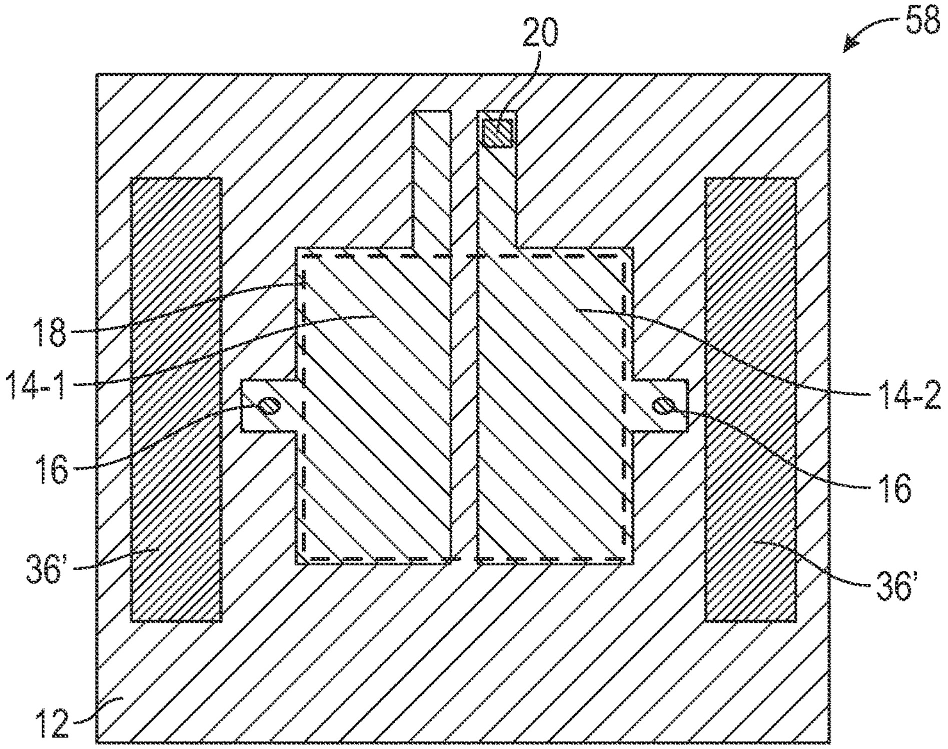
FIG. 14 is a top view of an LED package that is similar to the LED package of FIG. 12 where the thicker reactive material is formed as discontinuous portions along opposite sides of the patterned trace.

FIGS. 12 to 14 relate to embodiments where a reactive material 36' may be provided with an increased thickness above the support structure 12, thereby providing increased area for absorption of environmental ingress. In this regard, the reactive material 36' may form one or more three-dimensional structures that protrude upward from the support structure 12 so that sidewalls of the reactive material 36' may provide increased absorption of environmental ingress. This may also allow the reactive material 36' to occupy a reduced area of the support structure 12. The increased thickness may be provided by simply depositing more of the reactive material 36' on one or more surfaces of the support structure 12. Alternatively, the reactive material 36' may embody a pre-formed structure that is then attached to the support structure 12. For example, the reactive material 36' may be formed by a foil or block of material before being incorporated within an LED package.

FIG. 12 is a cross-sectional view of an LED package 54 that is similar to the LED package 34 of FIG. 3B for embodiments where the reactive material 36' is formed with increased thickness. As illustrated, the reactive material 36' may be formed with a thickness that is greater than a thickness of the patterned trace 14-1, 14-2. For example, the thickness of the reactive material 36' may be at least twice the thickness of the patterned trace 14-1, 14-2 as measured perpendicular to the top surface of the support structure 12. In further embodiments, the thickness of the reactive material 36 may be less than a thickness of the LED chip 22. Accordingly, sidewalls of the reactive material 36' have increased surface area for absorption of environmental ingress.

FIG. 13 is a top view of an LED package 56 that is similar to the LED package 54 of FIG. 12 where the thicker reactive material 36' is formed as discontinuous portions proximate corners of the support structure 12. As such, increased sidewalls of the reactive material 36' may be well positioned to interact with foreign substances entering the LED package 56 at or near the corners. While illustrated as four rectangles in FIG. 13, the reactive material 36' may be arranged proximate the corners in a variety of shapes, including those illustrated in any of FIGS. 3A, 5, 7, and 8.

FIG. 14 is a top view of an LED package 56 that is similar to the LED package 54 of FIG. 12 where the thicker reactive material 36' is formed as discontinuous portions along opposite sides of the patterned trace 14-1, 14-2. In this manner, the thicker reactive material 36' may be formed in a similar manner as described above for FIG. 9. In further embodiments, the thicker reactive material 36' may be formed with reduced surface area on the support structure 12 proximate the vias 16 as illustrated in FIG. 6.

Figure 15A:
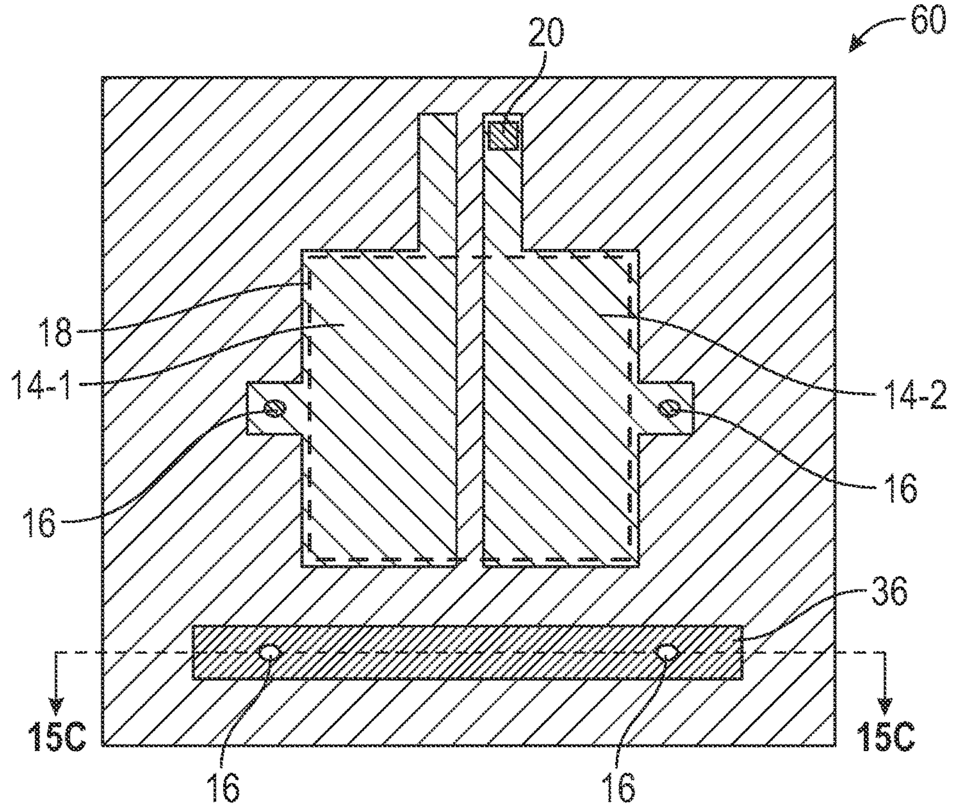
FIG. 15A is a top view of an LED package where the reactive material is formed as part of an electrical circuit that is separate from the patterned trace.
Figure 15B:
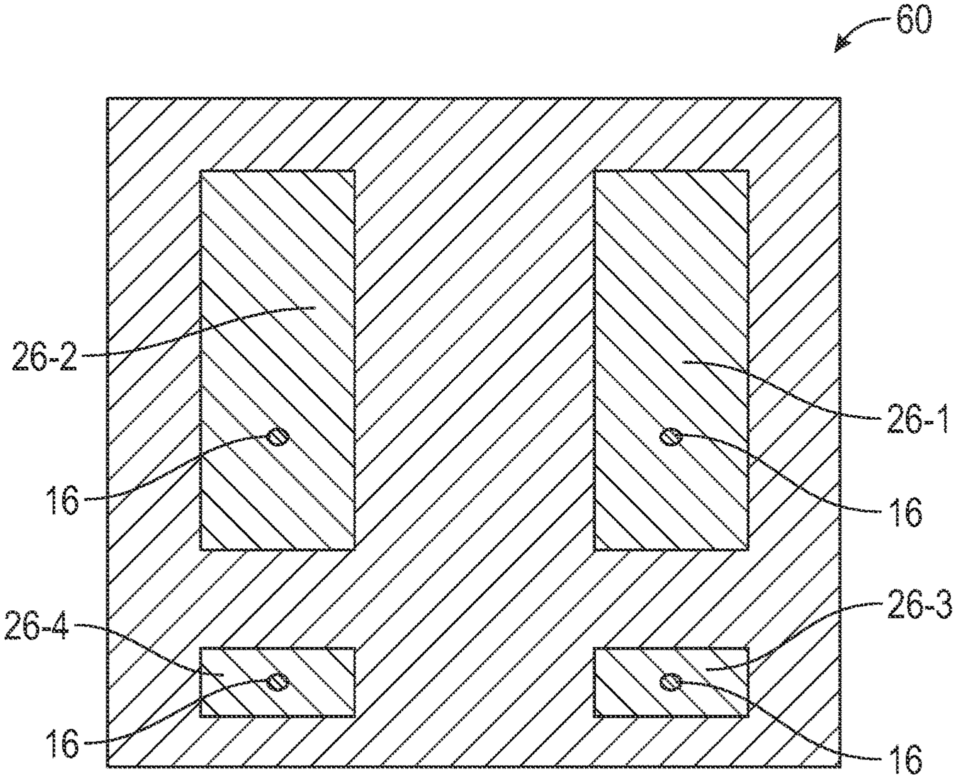
FIG. 15B is a bottom view of the LED package of FIG. 15A illustrating separate mounting pads that are electrically coupled to the reactive material by way of the additional vias.
Figure 15C:
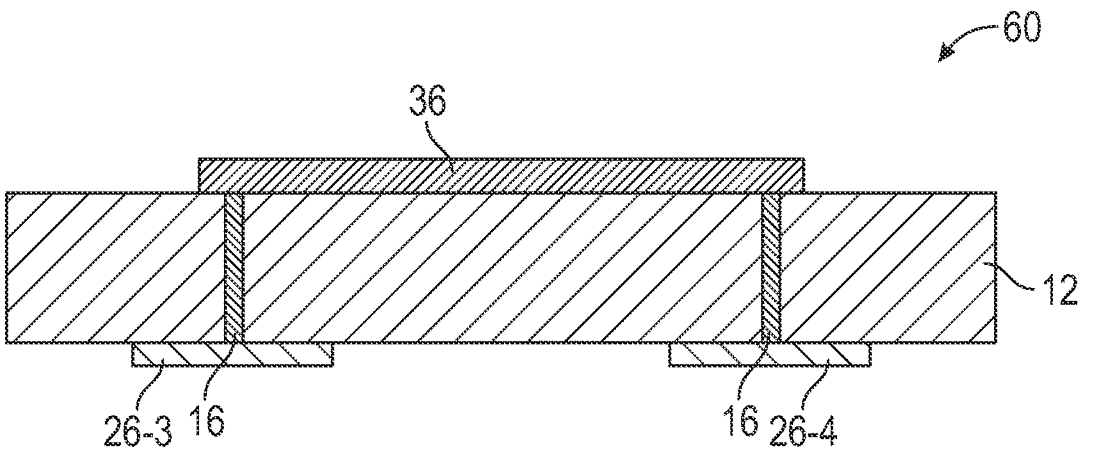
FIG. 15C is a cross-sectional view of the LED package of FIG. 15A taken along the sectional line 15C-15C of FIG. 15A.

FIGS. 15A to 15C are views of an LED package 60 where the reactive material 36 is configured to be electrically active during operation for enhanced attraction of environmental ingress. With current flow during operation, the reactive material 36 may be more reactive to foreign substances entering the LED package 60, thereby more efficiently attracting the foreign substances away from other package elements. In such embodiments, the reactive material 36 is selected to be electrically conductive and is formed as part of a circuit within the LED package 60. FIG. 15A is a top view of the LED package 60 where the reactive material 36 is formed as part of an electrical circuit that is separate from the patterned trace 14-1, 14-2. Additional vias 16 may be electrically coupled to the reactive material 36. FIG. 15B is a bottom view of the LED package 60 of FIG. 15A illustrating separate mounting pads 26-3, 26-4 that are electrically coupled to the reactive material 36 by way of the additional vias 16. The view provided by FIG. 15B is from the perspective of flipping the view of FIG. 15A over from left to right. FIG. 15C is a cross-sectional view of the LED package 60 taken along the sectional line 15C-15C of FIG. 15A. By having a pair of mounting pads 26-3, 26-4 for the reactive material 36 that are separate from a pair of mounting pads 26-1, 26-2 for the patterned trace 14-1, 14-2 and LED chip, the current applied to each may be applied independently from one another. For example, the reactive material 36 may be effective with less current than what is required to activate the LED chip.

While reactive materials have been previously described as coatings, layers, and/or pre-formed structures within LED packages, the reactive materials may also be incorporated as a distribution of particles embedded within other package elements. For particle embodiments, the reactive materials may include any of the materials previously described, such as particles of one or more of zinc, magnesium, iron, silica, titanium, tungsten, zeolites, metal organic frameworks, activated carbon, carbon aerogels, and salts such as calcium chloride and/or sodium chloride, among others. In certain embodiments, oxidation of certain particles, such as titanium, as a result of environmental ingress may form oxidized barriers or coatings along particle shells that provide an index of refraction step for increased light scattering and/or reduced light absorption. In this manner, rather than darkening over time with increased exposure, certain reactive materials in the form of particles may actually enhance light emissions.

Figure 16:
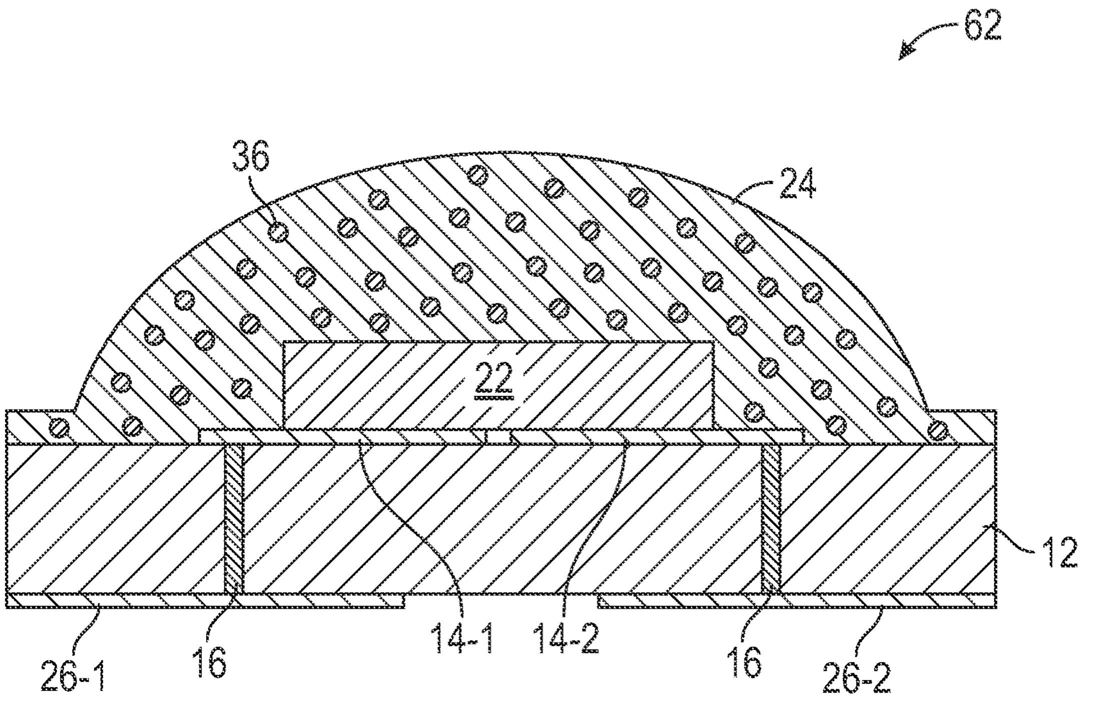
FIG. 16 is a cross-sectional view of an LED package that is similar to the LED package of FIG. 3B for embodiments where the reactive material is provided as a distribution of particles within the cover structure.

FIG. 16 is a cross-sectional view of an LED package 62 that is similar to the LED package 34 of FIG. 3B for embodiments where the reactive material 36 is provided as a distribution of particles within the cover structure 24. The particles of the reactive material 36 may be mixed within the cover structure 24 before the cover structure 24 is molded and/or hardened in place. For example, the cover structure 24 may comprise silicone that is mixed with the reactive material 36 before molding and/or curing. By positioning the reactive material 36 as a distribution of particles within the cover structure 24, the reactive material 36 may be well positioned to receive environmental ingress as it enters the LED package 62 throughout any portion of the cover structure 24. Additionally, the particles of the reactive material 36 may be positioned in primary light paths from the LED chip 22 to outside the cover structure 24. In this manner, the particles of the reactive material 36 may contribute to increased light scattering and/or extraction, particularly when certain oxidized coatings are formed.

Figure 17:
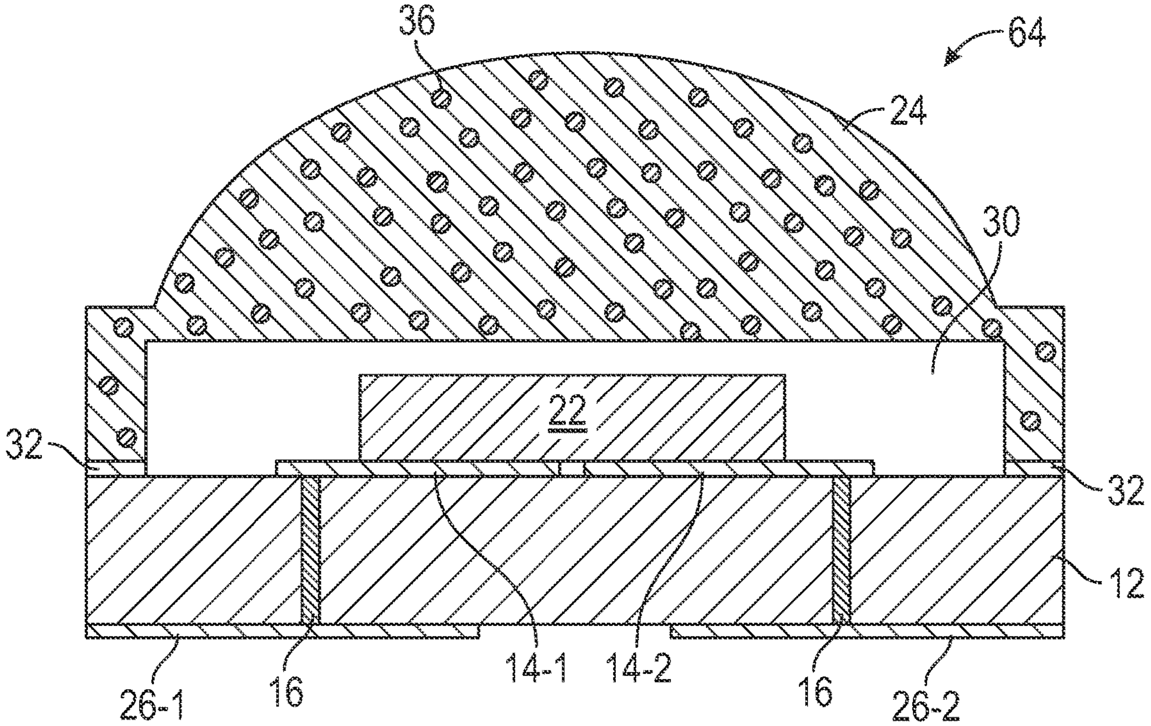
FIG. 17 is a cross-sectional view of an LED package that is similar to the LED package of FIG. 3B for embodiments where the reactive material is provided as a distribution of particles within the cover structure.

FIG. 17 is a cross-sectional view of an LED package 64 that is similar to the LED package 38 of FIG. 3B for embodiments where the reactive material 36 is provided as a distribution of particles within the cover structure 24. In this manner, the LED package 64 of FIG. 17 is also similar to the LED package 62 of FIG. 16 but with a different arrangement of the cover structure 24. In FIG. 17, the cover structure 24 forms the cavity 30 that encloses the LED chip 22 as previously described. In such embodiments, the cover structure 24 may be a pre-formed structure that is mixed with particles of the reactive material 36 before hardening and subsequent bonding to the support structure 12.

The embodiments of FIGS. 16 and 17 with particles of the reactive material 36 may also be combined with any of the previously described embodiments where the reactive material 36 may also be formed as coatings, layers, and/or pre-formed structures within LED packages.

Figure 18:
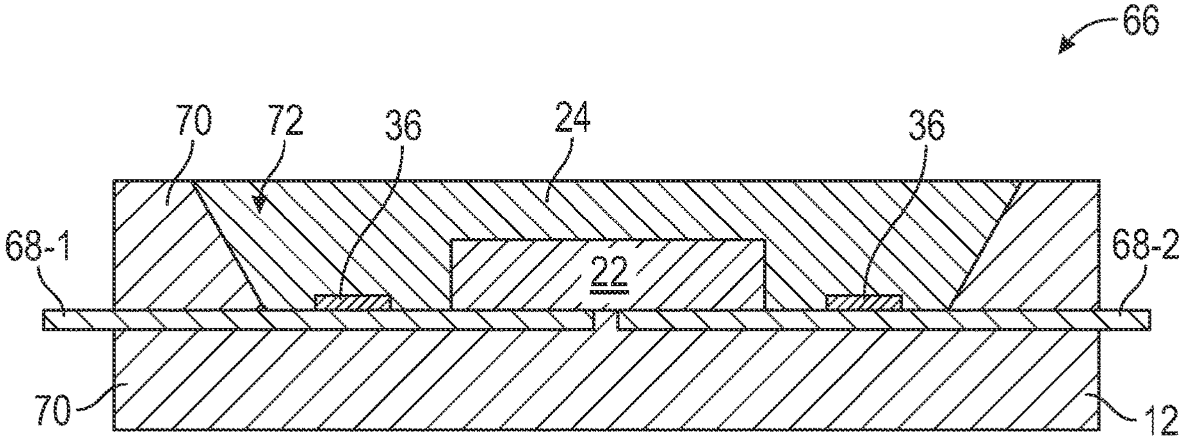
FIG. 18 is a cross-sectional view of an LED package that is similar to the LED package of FIG. 3B for embodiments where the support structure embodies a lead frame structure.
Figure 19:
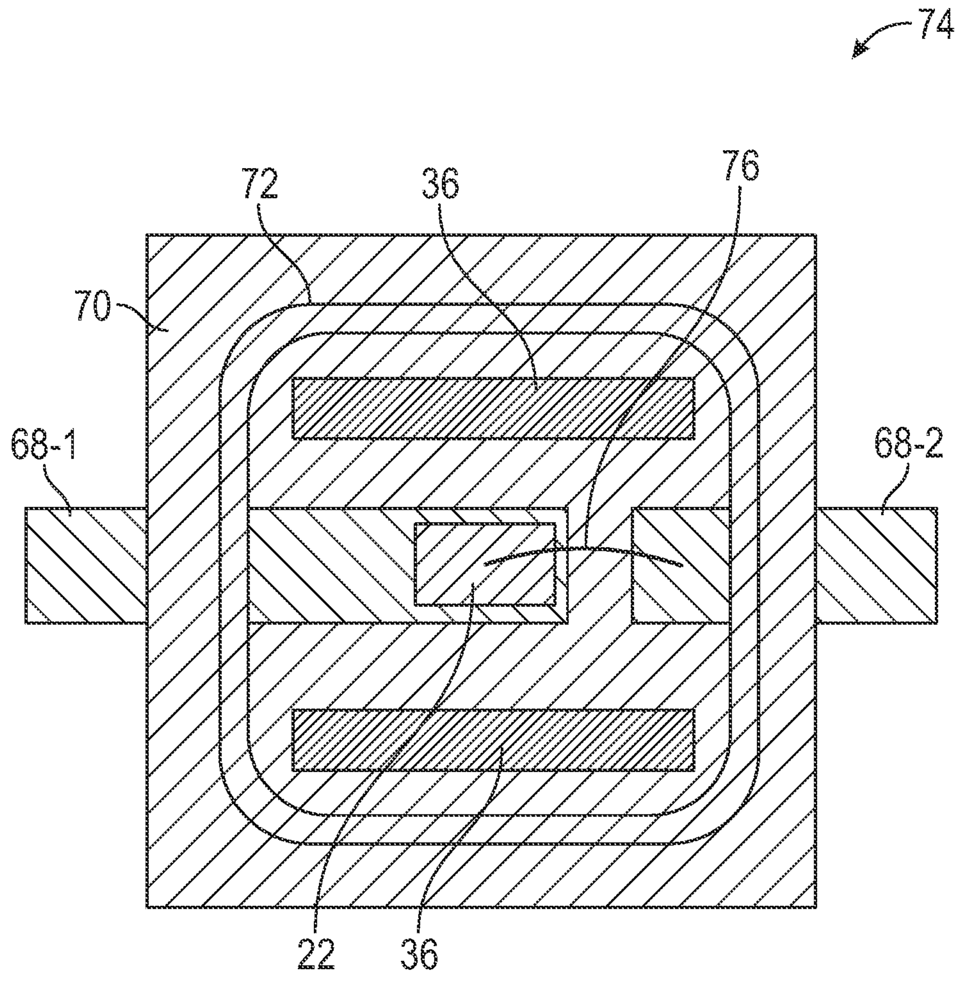
FIG. 19 is a top view of an LED package that is similar to the LED package of FIG. 18 for embodiments where the reactive material is spaced apart from the leads.

While the previous illustrations for FIGS. 1A to 17 are provided in the context where the support structure 12 comprises a submount with the patterned trace 14-1, 14-2, any of the arrangements of the reactive material 36 may also be applicable to embodiments where the support structure 12 embodies a lead frame structure. In this manner, the electrical connections provided by the patterned trace 14-1, 14-2 may be replaced with leads of a lead frame structure that is provided throughout portions of a lead frame body of insulating material. FIGS. 18 and 19 provide exemplary illustrations of LED packages with lead frame structures and the reactive material 36 as previously described. FIGS. 18 and 19 are meant to generally illustrate lead frame structures that could be implemented with any of the arrangements of the reactive material 36 described above for FIGS. 3A to 17.

FIG. 18 is a cross-sectional view of an LED package 66 that is similar to the LED package 34 of FIG. 3B for embodiments where the support structure 12 embodies a lead frame structure. In this regard, the support structure 12 includes leads 68-1, 68-2 that collectively form portions of a lead frame that is partially embedded within a body 70 of insulating material. The body 70 forms a recess 72 where the LED chip 22 resides and the LED chip 22 is electrically coupled to the leads 68-1, 68-2 at a floor of the recess 72. As illustrated, the LED chip 22 may be flip-chip mounted to the leads 68-1, 68-2 in certain embodiments, although the LED chip 22 could alternatively be connected by way of at least one wire bond. The cover structure 24 may embody an encapsulant material that fills the recess 72 of the body 70 around the LED chip 22. While a top surface of the cover structure 24 is illustrated as flat, the top surface could be formed in the shape of a curved lens above the body 70. As illustrated, the reactive material 36 may be formed on portions of the leads 68-1, 68-2 in certain embodiments. In this regard, the reactive material 36 may be positioned to receive environmental ingress that enters from outside the LED package 66 and travels between interfaces between the body 70 and the leads 68-1, 68-2. The reactive material 36 may further receive environmental ingress that enters from top surfaces of the cover structure 24.

FIG. 19 is a top view of an LED package 74 that is similar to the LED package 66 of FIG. 18 for embodiments where the reactive material 36 is spaced apart from the leads 68-1, 68-2. For illustrative purposes, the cover structure 24 of FIG. 18 is omitted to provide views of the body 70 along a floor of the recess 72; however, it is understood that the final structure may include the cover structure as illustrated for FIG. 18. As illustrated, the LED chip 22 may be mounted to one lead 68-1 and electrically coupled to the other lead 68-2 by way of a wire bond 76. In other embodiments, the LED chip 22 could be flip-chip mounted as illustrated in FIG. 18. From the top view, the reactive material 36 is positioned laterally spaced from the leads 68-1, 68-2. In this regard, the reactive material 36 may be positioned on surfaces of the body 70 at the floor of the recess 72. In certain embodiments, the reactive material 36 may form discontinuous portions that are arranged along opposite sides of the leads 68-1, 68-2 as illustrated. While only a single LED chip 22 is illustrated, it is understood that the LED package 74 may include any number of LED chips 22 and/or corresponding leads 68-1, 68-2.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
at least one LED chip;
a support structure comprising electrical connections coupled to the at least one LED chip, the support structure comprising a submount and the electrical connections comprising a patterned trace on a top surface of the submount; and
a reactive material on the submount and laterally spaced from the patterned trace, the reactive material configured to preferentially absorb environmental ingress in greater amounts than the electrical connections.

2. The LED package of claim 1, wherein the reactive material comprises a lower redox potential than the electrical connections.

3. The LED package of claim 1, wherein the reactive material comprises a continuous layer on the submount that extends around a perimeter of at least three sides of the at least one LED chip.

4. The LED package of claim 1, wherein the reactive material comprises a plurality of discontinuous portions on surfaces of the submount between the at least one LED chip and corners of the submount.

5. The LED package of claim 4, wherein each discontinuous portion of the plurality of discontinuous portions is non-parallel with all edges of the submount.

6. The LED package of claim 1, wherein the reactive material comprises a plurality of discontinuous portions on the submount, and each discontinuous portion of the plurality of discontinuous portions has a longest width that is less than a width of the at least one LED chip.

7. The LED package of claim 6, wherein:
the patterned trace is electrically coupled to a plurality of vias that extend through the submount; and
each discontinuous portion of the plurality of discontinuous portions is on a surface of the submount between a peripheral edge of the submount and an individual via of the plurality of vias.

8. The LED package of claim 1, wherein the reactive material is on a top surface of the electrical connections.

9. The LED package of claim 8, wherein:
the patterned trace forms a die attach pad for the at least one LED chip; and
the reactive material is arranged along a perimeter of the die attach pad.

10. The LED package of claim 1, wherein a thickness of the reactive material is greater than a thickness of the electrical connections.

11. The LED package of claim 1, wherein the reactive material is configured to be electrically active during operation.

12. The LED package of claim 11, wherein the support structure comprises additional electrical connections that are separately coupled to the reactive material.

13. The LED package of claim 1, further comprising a cover structure over the at least one LED chip, wherein the reactive material forms a distribution of particles within the cover structure.

14. A light-emitting diode (LED) package comprising:
at least one LED chip;
a lead frame at least electrically coupled to the at least one LED chip;
a body formed about portions of the lead frame, the body forming a floor such that the at least one LED chip is electrically coupled to the lead frame at the floor; and
a reactive material configured to preferentially absorb environmental ingress in greater amounts than the lead frame, wherein the reactive material is arranged on the floor of the body and a thickness of the reactive material from the floor is less than a thickness of the at least one LED chip.

15. The LED package of claim 14, wherein the reactive material is arranged on one or more surfaces of the lead frame.

16. The LED package of claim 14, wherein the reactive material is arranged on the body and spaced apart from the lead frame and the at least one LED chip on the floor.

17. The LED package of claim 14, wherein the reactive material comprises a lower redox potential than the electrical connections.

18. A light-emitting diode (LED) package comprising:
at least one LED chip;
a support structure comprising electrical connections coupled to the at least one LED chip; and
a reactive material configured to preferentially absorb environmental ingress in greater amounts than the electrical connections, wherein a thickness of the reactive material is greater than a thickness of the electrical connections.

19. A light-emitting diode (LED) package comprising:
at least one LED chip;
a support structure comprising electrical connections coupled to the at least one LED chip; and
a reactive material configured to preferentially absorb environmental ingress in greater amounts than the electrical connections, wherein the reactive material is configured to be electrically active during operation.

20. The LED package of claim 19, wherein the support structure comprises additional electrical connections that are separately coupled to the reactive material.

* * * * *